United States Patent [19]
Watanabe et al.

[11] Patent Number: 5,138,521
[45] Date of Patent: Aug. 11, 1992

[54] ELECTRONIC COMPONENT ASSEMBLY WITH DIRECT MOUNTING FOR PROPER AND EFFECTIVE COOLING

[75] Inventors: Makoto Watanabe, Takatsuki; Hiroyuki Nishi; Keiji Gemma, both of Nagaokakyo, all of Japan

[73] Assignee: Omron Tateisi Electronics Co., Kyoto, Japan

[21] Appl. No.: 506,549

[22] Filed: Apr. 6, 1990

Related U.S. Application Data

[63] Continuation of Ser. No. 319,894, Mar. 7, 1989, abandoned, which is a continuation of Ser. No. 143,267, Jan. 5, 1988, abandoned, which is a continuation of Ser. No. 847,514, Apr. 3, 1986, abandoned.

[30] Foreign Application Priority Data

| Apr. 5, 1985 | [JP] | Japan | 60-51334[U] |
| Sep. 9, 1985 | [JP] | Japan | 60-199099 |
| Sep. 24, 1985 | [JP] | Japan | 60-146266[U] |
| Oct. 30, 1985 | [JP] | Japan | 60-167374[U] |

[51] Int. Cl.$^5$ ............................................. H01L 23/34
[52] U.S. Cl. .................................. 361/383; 174/16.3; 361/388
[58] Field of Search ............... 361/383, 388; 174/16.3; 357/81

[56] References Cited

U.S. PATENT DOCUMENTS

| 3,058,020 | 10/1962 | Balan | 174/16.3 X |
| 3,180,404 | 4/1965 | Nelson et al. | 174/16.3 X |
| 3,303,392 | 2/1967 | Zelina . | |
| 3,462,553 | 8/1969 | Spranger | 361/383 X |
| 3,846,734 | 11/1974 | Pauza et al. | 361/403 X |
| 3,904,260 | 9/1975 | Cutchaw | 174/16 HS X |
| 4,069,497 | 1/1978 | Steidlitz | 357/81 X |
| 4,158,745 | 6/1979 | Keller | 174/16.3 X |
| 4,169,642 | 10/1979 | Mouissie . | |
| 4,218,724 | 8/1980 | Kaufman | 361/395 |
| 4,394,530 | 7/1983 | Kautman | 174/16.3 |
| 4,449,292 | 5/1984 | Kaufman | 174/16 HS X |
| 4,475,145 | 10/1984 | Heil et al. | 361/386 |
| 4,517,585 | 5/1985 | Ridout et al. | 174/16.3 X |
| 4,520,425 | 5/1985 | Ito | 361/386 X |
| 4,546,410 | 10/1985 | Kaufman | 361/387 |
| 4,557,225 | 12/1985 | Sagues et al. | 361/383 X |
| 4,561,011 | 12/1985 | Kohara et al. | 361/386 |
| 4,587,594 | 5/1986 | McPherson | 361/386 X |

FOREIGN PATENT DOCUMENTS

| 2722142 | 11/1978 | Fed. Rep. of Germany | 361/386 |
| 3412510 | 10/1984 | Fed. Rep. of Germany . | |
| 3335377 | 4/1985 | Fed. Rep. of Germany | 361/381 |
| 2404991 | 4/1979 | France . | |
| 55-113351 | 9/1980 | Japan | 361/381 |

OTHER PUBLICATIONS

Mulligan, J. M., Snap-On-Heat Exchanger, IBM Tech. Discl. Bul., vol. 10, No. 8, Jan. 1968, p. 1242.
Kunkler, E. W., Pedroza, G. C., "Fixture for Assembling Heat Sink to Module", IBM Tech. Discl. Bul., vol. 23, No. 8, Jan. 1981, pp. 3623-3624.
Almquist, F. A., Parsapour, H. B., "Spring-Clip Mounted Extruded at Heat Sink", IBM Bul., vol. 23, No. 12, May 1981, pp. 5303-5304.

Primary Examiner—Leo P. Picard
Assistant Examiner—D. A. Tone
Attorney, Agent, or Firm—Fish & Richardson

[57] ABSTRACT

This electronic component assembly includes: a body construction comprising a planar base portion, a fin provided as projecting from the planar base portion of the body construction, and a heat generating element fixedly attached to the planar base portion of the body construction. Thereby, very good heat dissipation is made available for the heat generating element, since no intermediate heat dissipating plate is used.

10 Claims, 13 Drawing Sheets

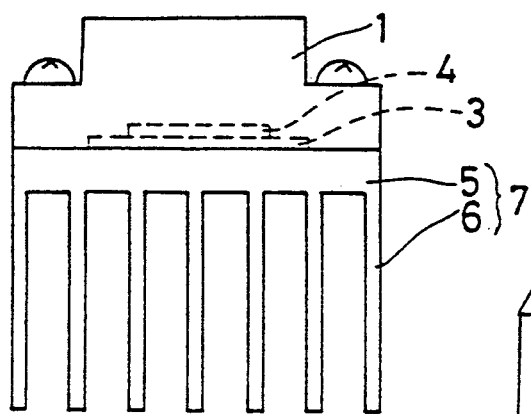
FIG. 1
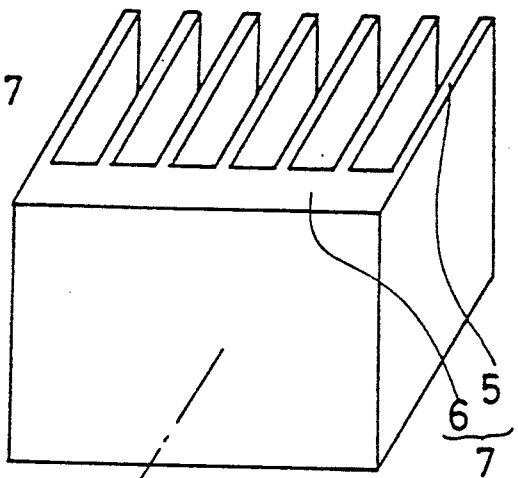
FIG. 2
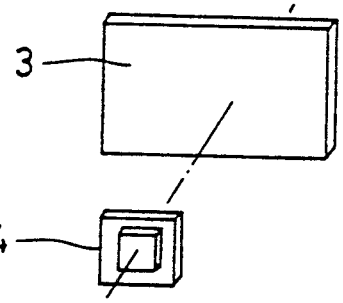
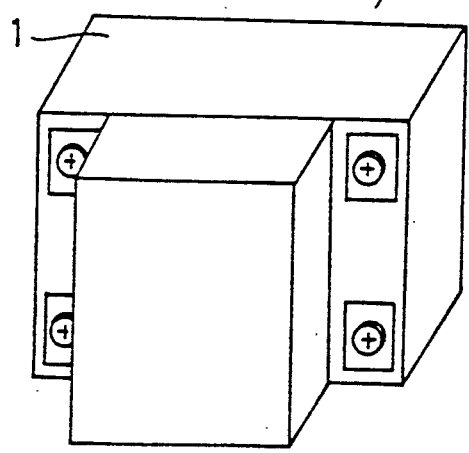

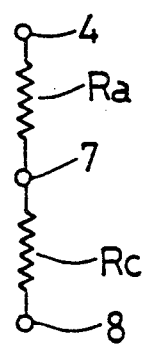
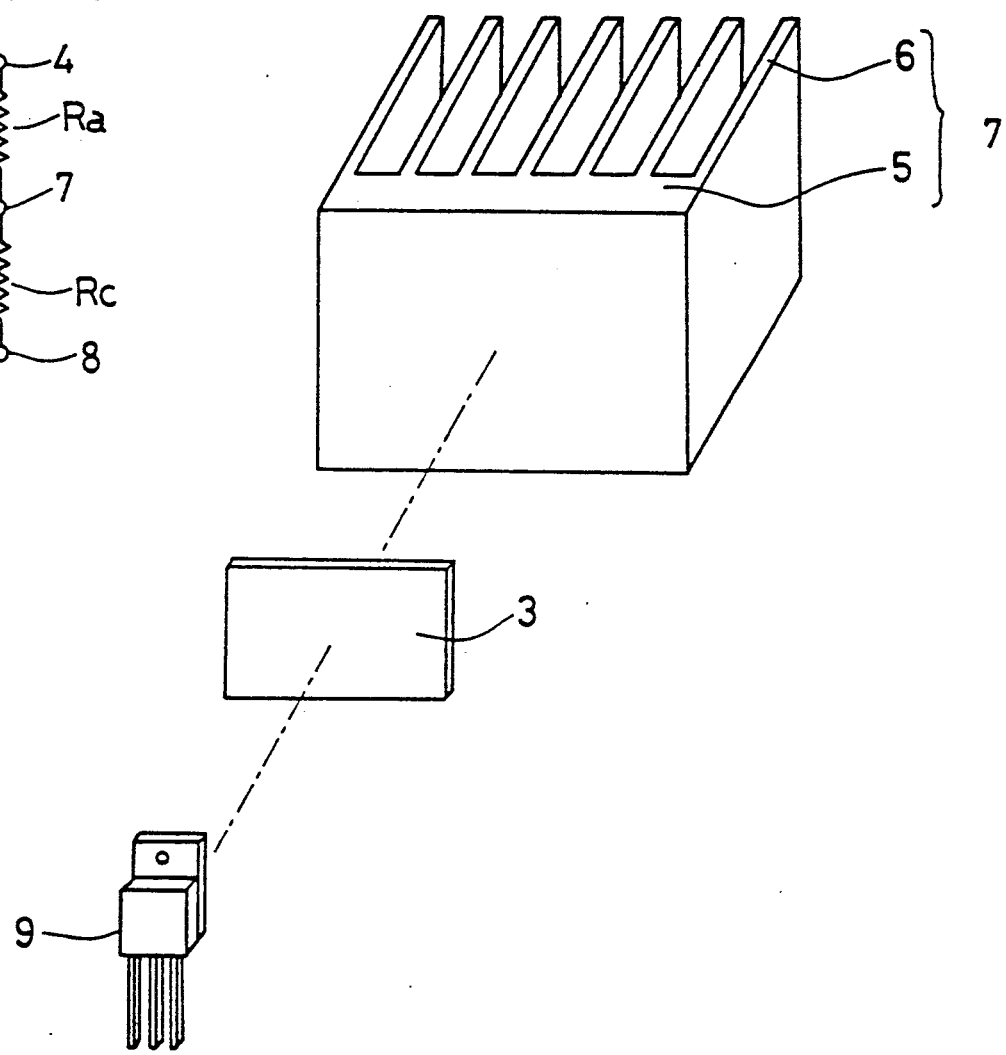

ELECTRONIC COMPONENT ASSEMBLY WITH DIRECT MOUNTING FOR PROPER AND EFFECTIVE COOLING

This application is a continuation of U.S. application Ser. No. 07/319,894, filed Mar. 7, 1989, now abandoned, which is a continuation of Ser. No. 07/143,267 filed Jan. 5, 1988, abandoned, which is a continuation of Ser. No. 06/847,514 filed Apr. 3, 1986, abandoned.

BACKGOUND OF THE INVENTION

The present invention relates to the field of electronic component assembly construction, and more specifically relates to an electronic component assembly which is constructed so as to have good thermal characteristics by having good heat dissipation.

Generally, an electronic component assembly such as a solid state relay is built with a structure which is adapted to dissipate heat generated in said electronic component assembly. In FIG. 6 of the accompanying drawings, a front view of a typical prior art type such electronic component assembly is shown for explaining its thermal deficiencies. In this construction, a power semiconductor device 4 such as a thyristor, which is prone to generate a considerable amount of heat during operation, is mounted to the upper surface in the figure of an insulating plate 3. This insulating plate 3 is then mounted with its lower surface on the upper surface of a heat dissipation plate 2, the lower surface of which is fixedly mounted on the inner surface (the upper surface in the figure) of the bottom portion 5 of a case 1 for the electronic component assembly. And, quite typically, in order to encourage the dissipation of heat, the outer surface (the lower surface in the figure) of the case 1 of the electronic component assembly is provided with a plurality of heat dissipation fins 6, for cooling said electronic component assembly by the circulation of air therethrough: thus, these fins 6 and the bottom portion 5 of the case 1 together constitute a heat dissipating assembly 7. In mounting this electronic component assembly to an electronic system, typically the base 5 of the electronic component assembly is mounted to a base board with the fins 6 protruding.

This electronic component assembly has thermal properties as illustrated by the thermal equivalent diagram of FIG. 7. Specifically, there is present a thermal resistivity denoted as Ra between the power semiconductor device 4 and the heat dissipation plate 2, a thermal resistivity denoted as Rb between said heat dissipation plate 2 and the heat dissipating assembly 7, and a thermal resistivity denoted as Rc between said heat dissipating assembly 7 and the atmosphere denoted as 8; and these three thermal resistivities Ra, Rb, and Rc are combined in series. Accordingly, there is present a considerable total overall thermal resistivity between the power semiconductor device 4 and the atomsphere 8, and this can cause the heat dissipating effect to be poor.

According to such a prior art type of construction for an electronic component assembly, since the heat dissipating assembly 7 is constituted as a separate component part, the heat dissipating performance varies a great deal depending upon whether such a heat dissipating assembly is used or not, and, even when such a heat dissipating assembly is used, the contact between said heat dissipating assembly 7 and the heat dissipation plate 2 may be impaired by thermal deformation of said heat dissipation plate 2, thus causing an increase in the thermal resistivity Rb between said heat dissipation plate 2 and the heat dissipating assembly 7, which causes great detriment to the heat dissipation qualities of the electronic component assembly.

Further, because the heat dissipating assembly 7 is constituted as a separate component part, the number of parts is increased over what would otherwise be the case, and cost and complication of the electronic component assembly is accordingly increased. Further, the usability and the assemblability of the electronic component assembly are deteriorated.

In FIG. 11 of the accompanying drawings, a schematic front sectional view of another typical prior art type electronic component assembly is shown for explaining the particular thermal deficiencies appertaining thereto. In this construction, a power semiconductor device 44 such as a triac, which is prone to generate a considerable amount of heat during operation, is mounted to the upper surface in the figure of an electrically insulating plate 43. This insulating plate 43 is then mounted with its lower surface on the upper surface of a heat dissipation plate 42 which is fixedly secured to a case 41 to constitute the bottom thereof. A printed circuit board 46 is fixedly secured on the inside of the case 41, and various electronic components such as shown by the reference numeral 45 are mounted on said printed circuit board 46. Further, a metallic boss 48 formed with a screwed hole into which is to be threadingly engaged a male screw 47 is provided to the case 41, and said metallic boss 48 is electrically connected to a lead portion of the power semiconductor device 44, for instance to a first anode thereof, by a connecting conductor 50, and a cover 51 is fitted over the open top of the case 41.

According to such a structure, some heat dissipating effect is provided for the power semiconductor device 44 via the connecting conductor 50 and metallic boss 48. However, a problem exists with manufacturing the device, since the soldering of the one end of the connecting conductor 50 to the metallic boss 48 is rather difficult, because said metallic boss 48 provides a heat sink which absorbs the heat of soldering to a considerable extent.

Another problem that has occurred with such a electronic component assembly is that, since the heat dissipation surface therefor is substantially completely exposed, there is a significant risk of a user or some other person coming into contact with said heat dissipation surface, and in such a case said person may quite likely be injured, for instance may be burnt or scorched.

Yet another problem that has occurred with such a electronic component assembly relates to the molding process for the case components thereof. Molding of such parts (typically made of synthetic resin) is never perfectly accurate, and allowance should be made in the design for the fact that the parts may have fairly wide variation.

SUMMARY OF THE INVENTION

Accordingly, it is the primary object of the present invention to provide an electronic component assembly, which avoids the above described problems.

It is a further object of the present invention to provide such an electronic component assembly, which has a reduced number of component parts.

It is a further object of the present invention to provide such an electronic component assembly, which is cheap.

It is a yet further object of the present invention to provide such an electronic component assembly, which is easy to assemble.

It is a yet further object of the present invention to provide such an electronic component assembly, which is economical to manufacture.

It is a yet further object of the present invention to provide such an electronic component assembly, which has good usability and good assemblability.

It is a yet further object of the present invention to provide such an electronic component assembly, in which short circuiting is positively prevented.

It is a yet further object of the present invention to provide such an electronic component assembly, in which injury such as burning or scorching to a user or other person is positively prevented.

According to the present invention, these and other objects are accomplished by an electronic component assembly, comprising: a body construction comprising a planar base portion; a fin provided as projecting from said planar base portion of said body construction; and: a heat generating element fixedly attached to said planar base portion of said body construction.

According to the present invention as described above, since the heat generating element is fixedly attached to the planar base portion of the body construction, there is a saving of component parts, with the concomitant savings in assembly cost and difficulty, and also the effectiveness of heat dissipation is maximized, by elimination of the heat resistance provided by the conventional type of heat dissipating plate provided in the prior art.

Further, according to a more specialized aspect of the present invention, these and other objects are accomplished by an electronic component assembly as described above, wherein said body construction comprises mutually opposing side walls rising from a surface of said planar base portion opposite to said fin; or alternatively by such an electronic component assembly, wherein said heat generating element comprises a lead portion and an external terminal which is integrally formed with said lead portion.

According to such a specialization of the present invention, these mutually opposing side walls are very helpful for further heat dissipation. And, further, since the external terminal of the heat generating element is integrally formed with the lead portion thereof, because of the elimination of any soldering work the above outlined problems associated with such soldering are nullified.

Further, according to a yet more specialized aspect of the present invention, these and other objects are accomplished by an electronic component assembly as penultimately described above, further comprising: two case portions each of which is formed with two vertical wall portions, and each fitted with said vertical wall portions thereof extending on the inward sides of said mutually opposing side walls of said body construction to define partitions between said side walls of said body construction and the space defined inside said body construction; a printed circuit board received in said space defined inside said body construction; a cover fitted on said body construction; and: a pair of C shaped elastic engagement members formed on said cover, detachably engaged to shapes formed on said mutually opposing side walls of said body construction, and retaining said cover on said body construction.

According to such a specialization of the present invention, since a part of the case is made of case half portions, mounting of the printed circuit board and of the heat generating element is simplified and hence the manufacturability is increased. And, since the vertical wall portions of these case half portions extend on the inward sides of said mutually opposing side walls of said body construction to define partitions between said side walls of said body construction and the space defined inside said body construction, thereby said vertical wall portions of said case half portions provide good and effective insulation between the components housed in said body construction, and said mutually opposing side walls of said body construction which typically are electrically conductive. Accordingly, short circuiting is positively prevented.

Further, according to a yet more specialized aspect of the present invention, these and other objects are accomplished by an electronic component assembly as first described above, further comprising a protective cover fitted over said fin; and desirably said protective cover may be pierced with a hole not in register with said fin.

According to such a specialization of the present invention, since the protective cover is fitted over the fin, no person can touch said fin by accident. Accordingly, injury such as burning or scorching to a user or other person is positively prevented. And, if the cover is as is desirable formed as pierced with said hole not in register with said fin, then good ventilation for said fin will be assured, thus promoting good cooling of the electronic component assembly.

Further, according to another specialized aspect of the present invention, these and other objects are accomplished by an electronic component assembly as described above, wherein said vertical wall portions of said two case portions are connected together; and in this case said connected vertical wall portions of said two case portions may advantageously be formed one with an engagement groove and the other with an engagement ridge which engages with said engagement groove; and even more advantageously said other one of said connected vertical wall portions of said two case portions may be further formed one with a stop ridge which engages with said engagement ridge, when said engagement ridge is engaged with said engagement groove.

According to such a specialization of the present invention, even if the vertical wall portions of the two case portions are poorly manufactured or become distorted, nevertheless said vertical wall portions can be effectively and securely engaged together.

Further, according to yet another specialized aspect of the present invention, these and other objects are accomplished by an electronic component assembly as first described above, further comprising a printed circuit board received in a space defined inside said body construction, and an insulating member fitted between said printed circuit board and said heat generating element; and desirably said insulating member may be formed wih a circumferential wall, and/or with an aperture for connecting said printed circuit board to said heat generating element, and/or with internal dividing and insulating walls. Such an insulating member serves for providing good insulation between the heat generating element and the printed circuit board, and can serve for insulating different ones of said heat generating elements from one another or from the outer electroconductive case of the electronic component assembly.

BRIEF DESCRIPTION OF THE DRAWINGS

The present invention will now be shown and described with regard to certain of the preferred embodiments thereof, and with reference to the illustrative drawings, which however should not be considered as limitative of the present invention in any way, since the scope of the present invention is to be considered as being delimited solely by the accompanying claims, rather than by any particular features of the disclosed embodiments or of the drawings. In these drawings:

FIG. 1 is a front view of a first preferred embodiment of the electronic component assembly of the present invention;

FIG. 2 is an exploded perspective view of said first preferred embodiment electronic component assembly;

FIG. 3 is a thermal equivalent diagram for explaining the thermal resistivity properties of said first preferred embodiment electronic component assembly;

FIG. 4 is an exploded perspective view of a second preferred embodiment of the electronic component assembly of the present invention;

DESCRIPTION OF THE PREFERRED EMBODIMENTS

Figure 5:
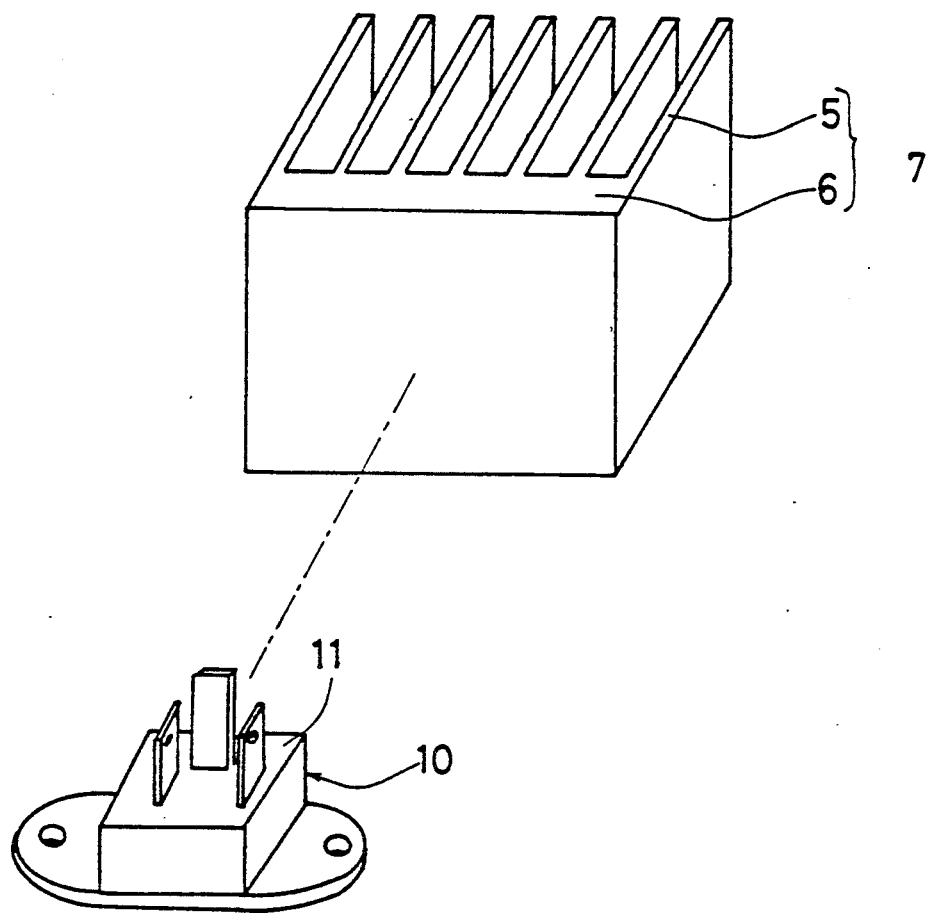
FIG. 5 is an exploded perspective view of a third preferred embodiment of the electronic component assembly of the present invention.

The present invention will now be described with reference to the preferred embodiments thereof. FIG. 1 shows the first preferred embodiment of the electronic component assembly of the present invention in front view, and FIG. 2 is an exploded perspective view of said first preferred embodiment; in these figures, parts corresponding to parts of the prior art described above with reference to FIGS. 5 and 6 are denoted by the same reference numerals, and detailed description thereof is omitted here.

Thus, in these figures, the reference numeral 4 denotes a power semiconductor device such as a thyristor, and said power semiconductor device 4 is fixedly attached to the upper surface in FIG. 1 of an insulating plate 3, the lower surface of which is directly fixedly mounted on the inner surface (the upper surface in said figure) of the bottom portion 5 of a case 1 for the electronic component assembly. And, in order to encourage the dissipation of heat, the outer surface (the lower surface in FIG. 1) of said bottom portion 5 of said case 1 of the electronic component assembly is provided with a plurality of heat dissipation fins 6, for cooling said electronic component assembly by the circulation of air therethrough: thus, these fins 6 and the bottom portion 5 of the case 1 together again constitute a heat dissipating assembly 7 which typically is integrally formed. In mounting this electronic component assembly to an electronic system, again typically the base 5 of the electronic component assembly is mounted to a base board with the fins 6 protruding.

In manufacturing and assembling this electronic component assembly, if for example the heat dissipating assembly 7 is made of material such as copper, then the insulating plate 3 is typically soldered directly thereto as it is; while if on the other hand said heat dissipating assembly 7 is made of material such as aluminum which is unsuitable for soldering, then said insulating plate 3 is typically soldered thereto after being surface processed by plating of some material such as nickel thereon. Thereafter, the power semiconductor device 4 is fixedly secured to the insulating plate 3 by soldering, and, after connecting the terminals of some typical control circuitry (not particularly shown) to the case 1 and to the power semiconductor device 4, the case 1 is bonded to the heat dissipating assembly 7. This heat dissipating assembly 7 may advantageously be made by cutting a length of extruded material into pieces of appropriate length.

According to this shown structure, since the conventional type of heat dissipating plate is eliminated from the structure, and the heat dissipator is integrated, a heat dissipating performance of a certain realistic level is definitely assured, and not only the usability in mounting this device into an electronic system is achieved, but also a reduction in cost is obtained and the total number of component parts is minimized. In particular, as is illustrated by the thermal equivalent diagram of FIG. 3. Specifically, there is present a thermal resistivity denoted as Ra between the power semiconductor device 4 and the heat dissipating assembly 7, and also a series connected thermal resistivity denoted as Rc between said heat dissipating assembly 7 and the atmosphere denoted as 8, and accordingly the previously present thermal resistivity denoted as Rb between the heat dissipation plate 2 and the heat dissipating assembly 7 has been eliminated. Thereby, the reliability and the quality of heat dissipation are much improved, and there is presently a much lower total overall thermal resistivity between the power semiconductor device 4 and the atmosphere 8 than in the prior art, and this causes the heat dissipating effect to be relatively excellent.

This heat dissipating performance can be further improved, according to a particular specialization of the present invention, by conducting an alumite process on the heat dissipator, i.e. by coating of aluminum oxide thereon.

FIG. 4 shows an exploded perspective view of a second preferred embodiment of the electronic component assembly of the present invention. In this second preferred embodiment, the power semiconductor device is a commercially available mold type device. If this device 9 is not insulated, an insulating plate 3 as utilized in the first preferred embodiment described above may be used, as shown in FIG. 4. Thus, again the benefit of high heat dissipation provided by the present invention is available.

Figure 6:
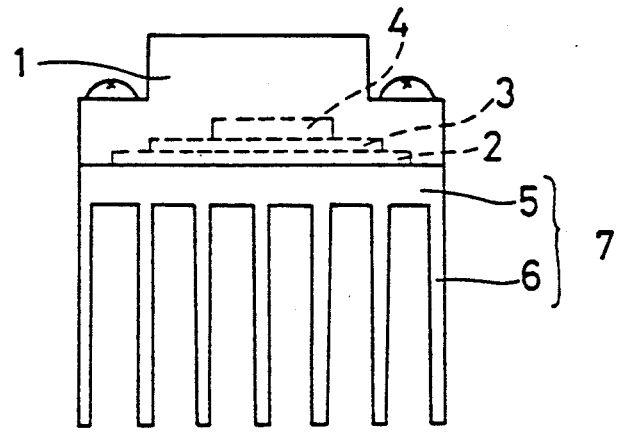
FIG. 6 relates to the prior art, and is a front view of a conventional electronic component assembly.
Figure 7:
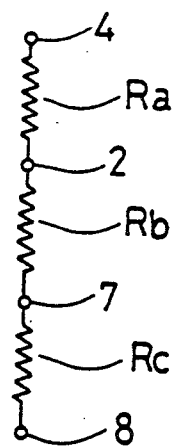
FIG. 7 similarly relates to the prior art, and is a thermal equivalent diagram, similar to FIG. 2 for the first preferred embodiment of the present invention, for explaining the thermal resistivity properties of said prior art electronic component assembly shown in FIG. 6.

On the other hand, in FIG. 5, which shows an expolded perspective view of a third preferred embodiment of the electronic component assembly of the present invention, since in this third preferred embodiment the power semiconductor device is a commercially available insulated device 10, no isulating plate as utilized in the first and second preferred embodiments described above is required, and as shown in FIG. 4, since the case itself may be used as the insulating plate, the power semiconductor device 10 may be directly bonded to the planar base portion 2 of the heat dissipation assembly 7. Again, the benefit of high heat dissipation provided by the present invention is available.

Figure 8:
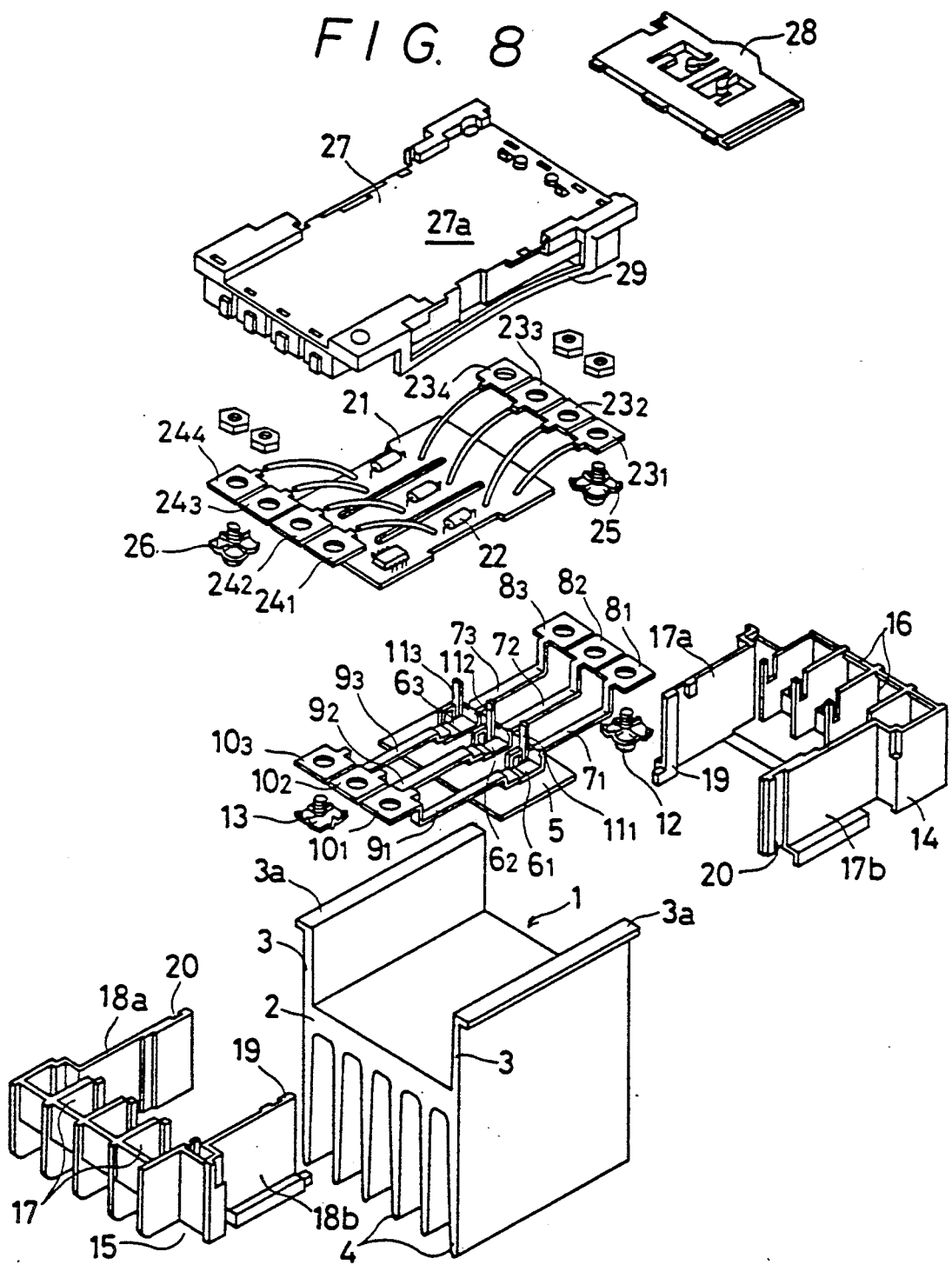
FIG. 8 is an exploded perspective view of a fourth preferred embodiment of the electronic component assembly of the present invention.
Figure 9:
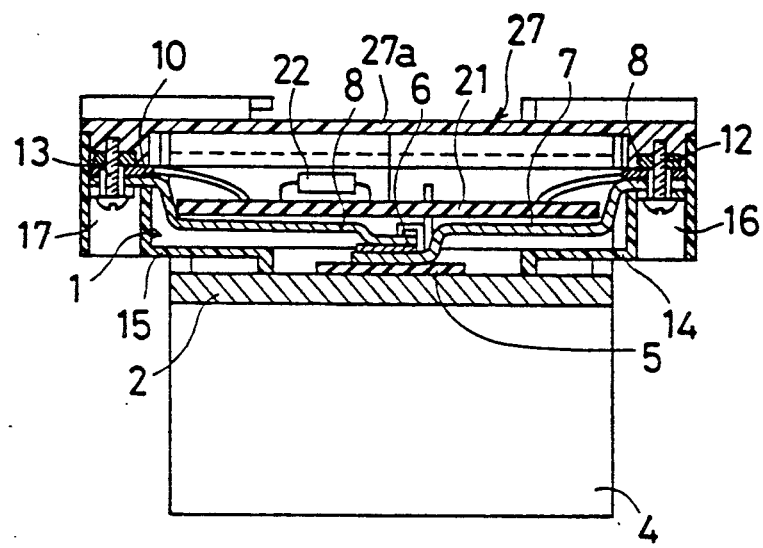
FIG. 9 is a schematic front sectional view of said fourth preferred embodiment electronic component assembly.
Figure 10:
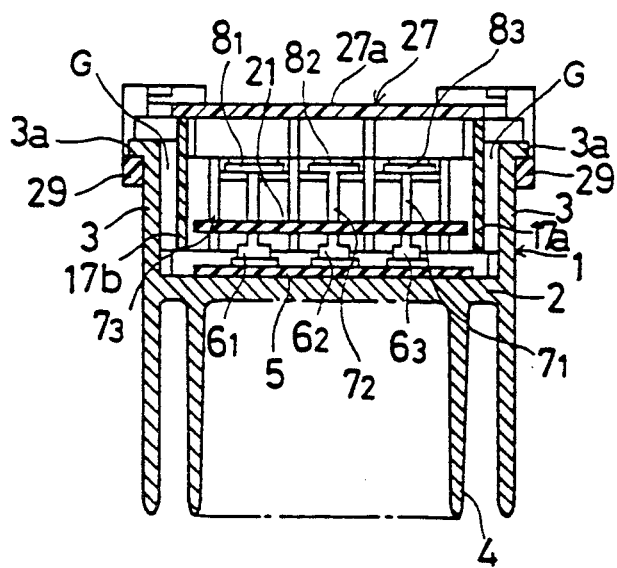
FIG. 10 is a schematic side sectional view of said fourth preferred embodiment electronic component assembly.

Now, in FIG. 8, there is shown an exploded perspective view of a fourth preferred embodiment of the electronic component assembly of the present invention, while FIG. 9 is a schematic front sectional view of said fourth preferred embodiment electronic component assembly and FIG. 10 is a schematic side sectional view of said fourth preferred embodiment electronic component assembly. In these figures, the reference numerals do not particularly correspond to those utilized in the descriptions and the drawings relating to the first three preferred embodiments as detailed above.

Herein, the reference numeral 1 denotes a main case member of the electronic component assembly, which is an integral member formed with a base portion 2 formed generally as a rectangle, two side wall portions 3 rising from opposite sides of said rectangular base portion 2 and opposing one another, and a plurality of fins 4 extending from the surface of said rectangular base portion 2 on the opposite side from said side wall portions 3. Such a case member construction can be easily formed by cutting a length of extruded material into pieces of appropriate length.

An electrically insulating plate 5 is fixedly attached to the upper surface in the figures of this base portion 2 of the main case member 1, and three (in this fourth preferred embodiment) semiconductor devices $6_1$, $6_2$, and $6_3$ such as triacs which correspond to the three phases of three phase AC current are fixedly attached to the upper surface in the figures of this electrically insulating plate 5. Each of these three triacs $6_1$, $6_2$, and $6_3$ has a respective first anode lead portion $7_1$, $7_2$, and $7_3$ projecting from it and at the ends of said first anode lead portions $7_1$, $7_2$, and $7_3$ there are formed respective external terminals $8_1$, $8_2$, and $8_3$. Similarly, each of the three triacs $6_1$, $6_2$, and $6_3$ has a respective second anode lead portion $9_1$, $9_2$, and $9_3$ projecting from it in the opposite direction from said first anode lead portions $7_1$, $7_2$, and $7_3$, and at the end of said second anode lead portions $9_1$, $9_2$, and $9_3$ there are formed respective external terminals $10_1$, $10_2$, and $10_3$. The triacs $6_1$, $6_2$, and $6_3$ further have upwardly projecting gate lead portions $11_1$, $11_2$, and $11_3$ which are connected to a printed circuit board to be described shortly. And the reference numeral 12 denotes a terminal fixing screw which, although this is not particularly shown, is screwed into a typical one of the first anode external terminals $8_1$, $8_2$, and $8_3$; in fact, all side first anode external terminals 81, 82, and 83 have such terminal fixing screws associated with them, although said screws are not shown in the figure. Similarly, the reference numeral 13 denotes a terminal fixing screw which, although this is not particularly shown, is screwed into a typical one of the second anode external terminals $10_1$, $10_2$, and $10_3$; in fact, all said second anode external terminals $10_1$, $10_2$, and $10_3$ have such terminal fixing screws associated with them, although said screws are not shown in the figure.

Two case side members 14 and 15 are provided, one at each of the sides of the rectangular base portion 2 not taken up by the side wall portions 3. Each of these case side members 14 and 15 is made of an electrically insulating material such as synthetic resin, and the case side member 14 is made with fitting notches 16 for the first anode external terminals $8_1$, $8_2$, and $8_3$, while similarly the other case side member 15 is made with fitting notches 17 for the second anode external terminals $10_1$, $10_2$, and $10_3$. And from the two ends of the case side member 14 there are two projecting vertical (in the figures) side wall portions 17a and 17b, while similarly from the two ends of the other case side member 15 there project two vertical (in the figures) side wall portions 18a and 18b. These side wall portions 17a, 17b and 18a, 18b extend parallel to the two side wall portions 3 which rise from the opposite sides of said rectangular base portion 2 on the inside sides of said side wall portions 3, so as to define insulating barriers between said side wall portions 3 and the components within the main case member 1 of the electronic component assembly. The ends of the side wall portions 17a and 18a are engaged to one another by a ridge portion 19 formed on the inside side of the side wall portion 17a and a groove portion 20 formed on the outside side of the side wall portion 18a, while similarly the ends of the side wall portions 17b and 18b are engaged to one another by a ridge portion 19 formed on the inside side of the side wall portion 17b and a groove portion 20 formed on the outside side of the side wall portion 18b. Thereby, the two case side members 14 and 15 are tightly held together towards the center of the electronic component assembly, so as to clamp the two side wall portions 3 between them and thereby to be held in position securely.

The reference numeral 21 denotes a printed circuit board, on which various component parts 22 for circuitry are mounted. This printed circuit board 21 is accomodated in the main case member 1 of the electronic component assembly over the insulating plate 5 and the triacs $6_1$, $6_2$, and $6_3$ mounted thereon, and a plurality of external terminals $23_1$, $23_2$, $23_3$, and $23_4$ on the one side thereof and $24_1$, $24_2$, $24_3$, and $24_4$ on the other side of said printed circuit board 21 are connected to said components mounted thereon. And the reference numeral 25 denotes a terminal fixing screw which, although this is not particularly shown, is screwed into a typical one of the external terminals $23_1$, $23_2$, and $23_3$; in fact, all said external terminals $23_1$, $23_2$, and $23_3$ have such terminal fixing screws associated with them, although said screws are not shown in the figure. Similarly, the reference numeral 26 denotes a terminal fixing screw which, although this is not particularly shown, is screwed into a typical one of the external terminals $24_1$, $24_2$, and $24_3$; in fact, all side external terminals $24_1$, $24_2$, and $24_3$ have such terminal fixing screws associated with them, although said screws are not shown in the figure.

The reference numeral 27 denotes a cover made of an electrically insulating material such as synthetic resin, which is fitted over the open top of the main case portion 1, and the outer surface 27a of this cover 27 is formed so as to be detachably mounted to a rail or the like, not shown in the drawings, via a movable piece 28 for engagement. And the side edges of the cover 27 are formed with C shaped elastic rails 29 which can be detachably engaged with flanges 3a, 3a provided on the outwardly facing surfaces of the side wall portions 3 of the main case member 1 of the electronic component assembly, so as to retain the cover 27 on the top of said electronic component assembly.

Figure 11:
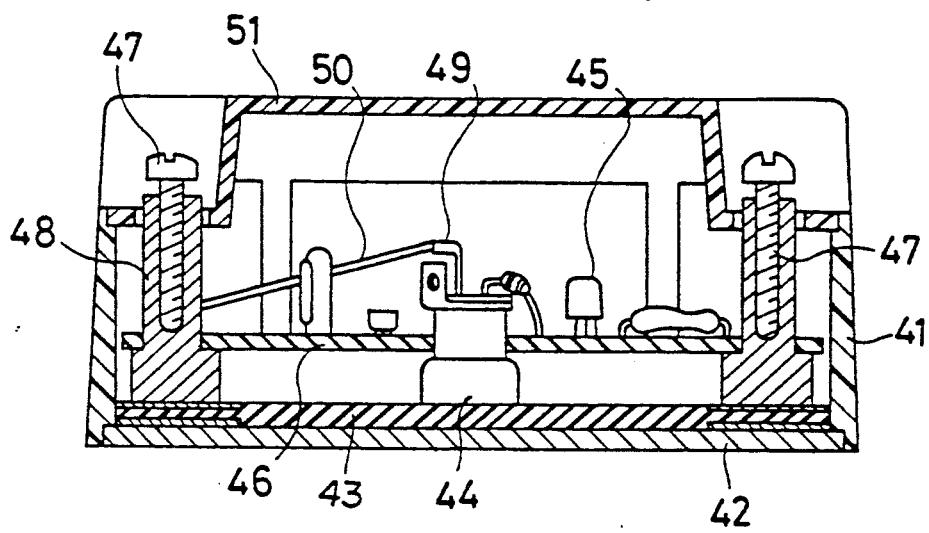
FIG. 11 relates to the prior art, and is a schematic front sectional view of a known type of electronic component assembly.

According to the above explained structure for the electronic component assembly, by fitting the two case side members 14 and 15 together from opposite sides of the electronic component assembly and connecting said two case side members 14 and 15 together, and by fixing the insulating plate 5 and the triacs $6_1$, $6_2$, and $6_3$ mounted thereon to the internal surface of the bottom wall portion 2 of the main case member 1, a well defined space is provided for accomodating the printed circuit board 21 and the components affixed thereto, and manufacture is made easy. Further, according to this construction, it is possible to set the external terminals $8_1$, $8_2$, $8_3$, $10_1$, $10_2$ and $10_3$ well as the triacs 61, 62, and 63 on the side of the case 1. In this case, since the lead portions 71, 72, and 73 and $9_1$, $9_2$, and $9_3$ of the triacs $6_1$, $6_2$, and $6_3$ are integrally formed with the external terminals $8_1$, $8_2$, and $8_3$ and $10_1$, $10_2$, and $10_3$ respectively, no problems arise with soldering work (which is not now required at all for these terminals) as were detailed with regard to the prior art of FIG. 11, and the assembly of this electronic component assembly can be performed quickly and easily.

Furthermore, since heat from the triacs $6_1$, $6_2$, and $6_3$ evolved during operation thereof is dissipated through the bottom wall portion 2 of the main case member 1, and also through the opposing side walls 3 thereof, and since the fin portions 4 are integrally formed on the outer surface of said bottom wall portions 2, the heat dissipation effect is very excellent. This heat dissipation effect is enhanced by the fact that the electronic component assembly is mounted by the top surface 27a of the cover 27 being mounted to a mounting member not shown such as a rail, which causes the fins 4 to be protruded well away from said mounting member and thus to provide good heat dissipation.

Further, although since the electroconductive opposing side wall portions 3 are formed integrally with the bottom portion 2 of the main case member 1 and with the fin portions 4 this member necessarily becomes somewhat heavy, nevertheless since the cover 27 is well and securely clipped and clamped to said main case member 1 by the C shaped elastic engagements pieces 29 and the flanges 3a of the opposing side wall portions 3, play therebetween is absorbed and appropriate engagement of the two members can be achieved.

Furthermore, since the lead portions $7_1$, $7_2$, and $7_3$ and $9_1$, $9_2$, and $9_3$ of the triacs $6_1$, $6_2$, and $6_3$ are arranged along near the internal surfaces of the electroconductive opposing side wall portions 3, if nothing were done to prevent it, a possibility of a short circuit might exist; but, because the vertical side wall portions 17a, 17b and 18a, 18b are provided as insulating partition walls, no such possibility substantially exists. Further, because gaps shown as G in FIG. 10 are provided between said main case member 1 electroconductive opposing side wall portions 3 and said vertical side wall portions 17a, 17b and 18a, 18b, so as to define electrically insulating spaces, thereby a further safeguard against short circuiting is made available.

Figure 12:
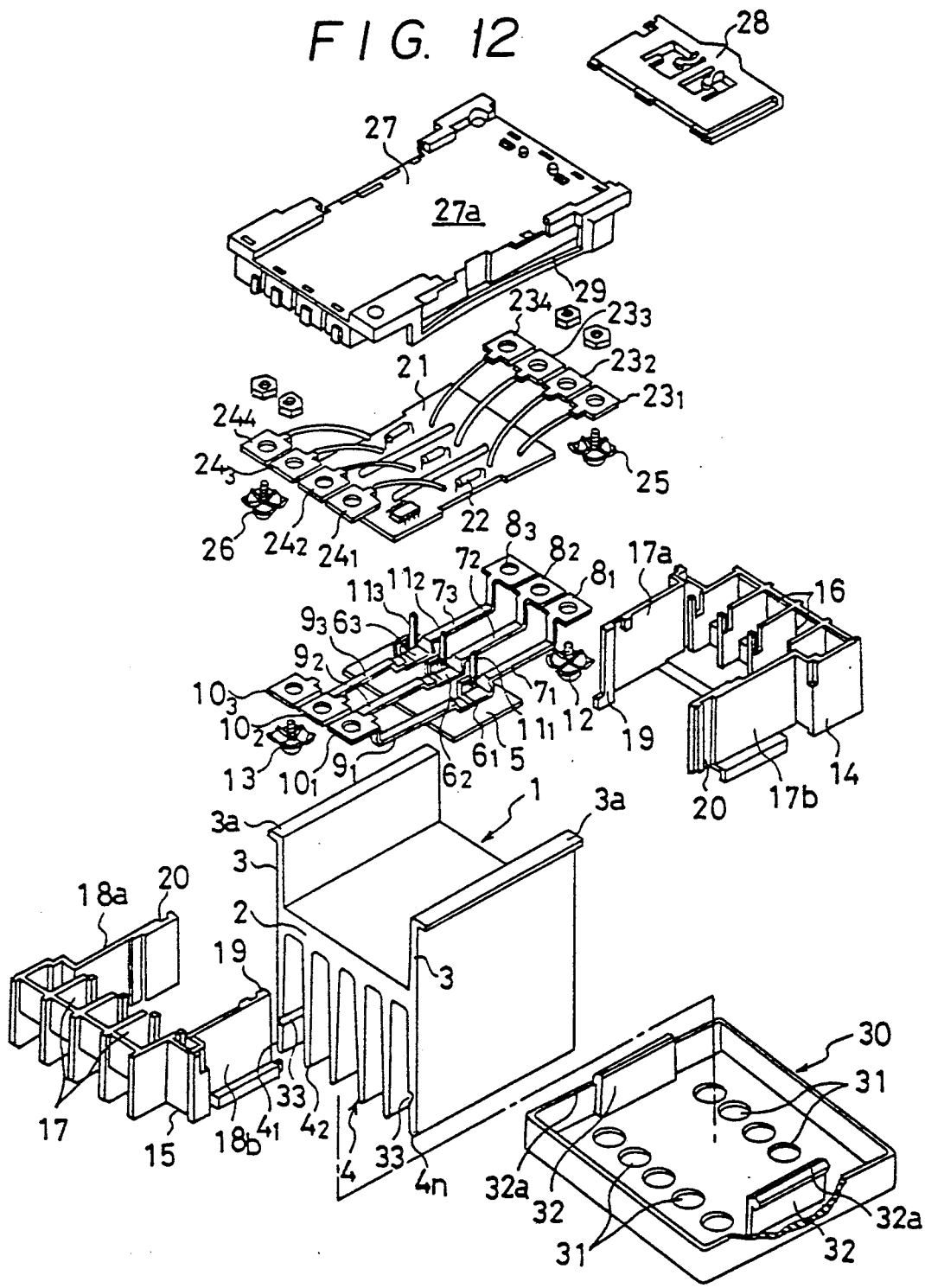
FIG. 12 is an exploded perspective view, similar to FIG. 9 for the fourth preferred embodiment, showing a fifth preferred embodiment of the electronic component assembly of the present invention, said fifth preferred embodiment electronic component assembly further including a protective shield cap for its fins.
Figure 13:
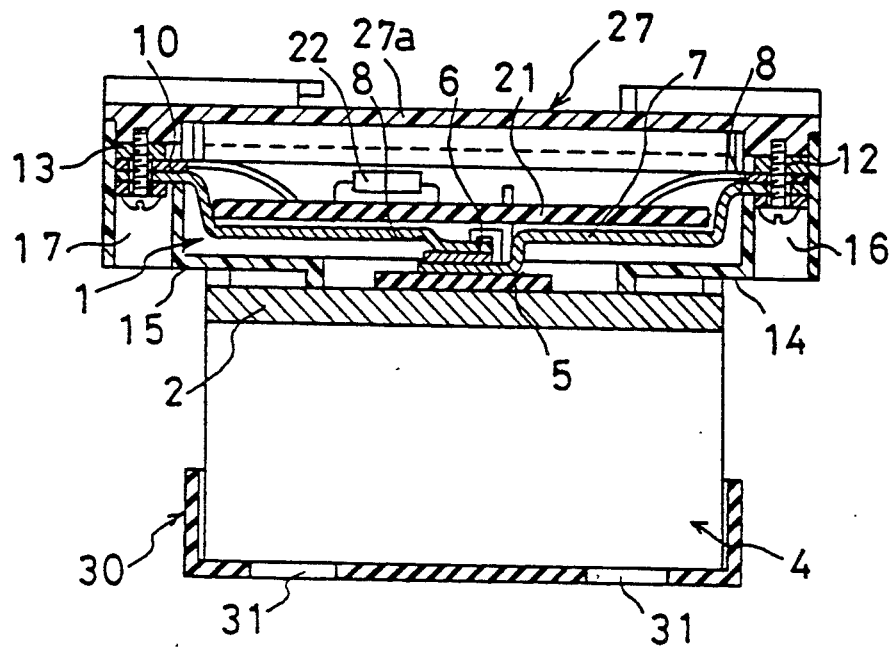
FIG. 13 is a schematic front sectional view, similar to FIG. 10 for the fourth preferred embodiment, showing said fifth preferred embodiment electronic component assembly.
Figure 14:
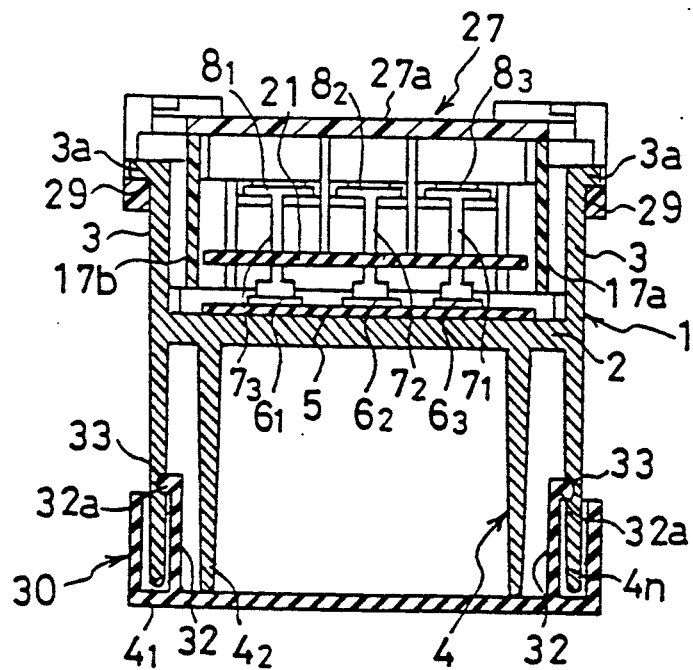
FIG. 14 is a schematic side sectional view, similar to FIG. 11 for the fourth preferred embodiment, showing said fifth preferred embodiment electronic component assembly.

Now, in FIG. 12, there is shown an exploded perspective view of a fifth preferred embodiment of the electronic component assembly of the present invention, while FIG. 13 is a schematic front sectional view of said fifth preferred embodiment electronic component assembly and FIG. 14 is a schematic side sectional view of said fifth preferred embodiment electronic component assembly. In these figures, reference numerals particularly correspond to those utilized in the descriptions and the drawings relating to the fourth preferred embodiment as detailed above.

Figure 15:
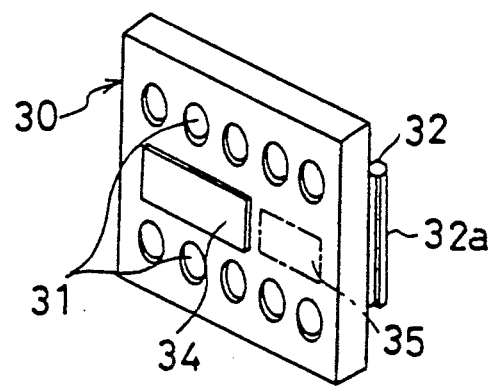
FIG. 15 is a perspective view of said protective shield cap as seen from the bottom.

This fifth preferred embodiment differs from the fourth preferred embodiment discussed and illustrated above, only in that the inner surfaces of the outermost two ones 4l and 4n of the fins 4 are formed with grooves 3 on them, and a box shaped insulating safety cover 30 is provided over the fins 4, with elastic projections 32 extending from opposing ones of its sides and formed with engaging ribs 32a, adapted to clippingly engage with the grooves 33 on the outermost two fins 4l and 4n so as to retain the box shaped insulating safety cover 30 over the fins 4. The cover 30 is shown in perspective view in FIG. 15. Further, the bottom of the insulating safety cover 30 is formed with a number of holes 31 which oppose the spaces between the fins 4, i.e. do not oppose the fins 4 themselves. According to such a construction, this insulating safety cover 30 is effective for preventing a person from touching the fins 4 and being injured or burnt or scorched thereby. Yet, via the holes 31, the fins 4 can receive an adequate amount of cooling. An additional advantage of this construction is that the external surface of this safety cover 30 is available for display purposes, such as for the affixing of a sticker 34 as shown in FIG. 15 for indicating information about the electronic component assembly, or for advertising or the like. A mark area 35 is also provided for the use of the user of this electronic component assembly; thereby the usability of the electronic component assembly is even further enhanced.

Figure 16:
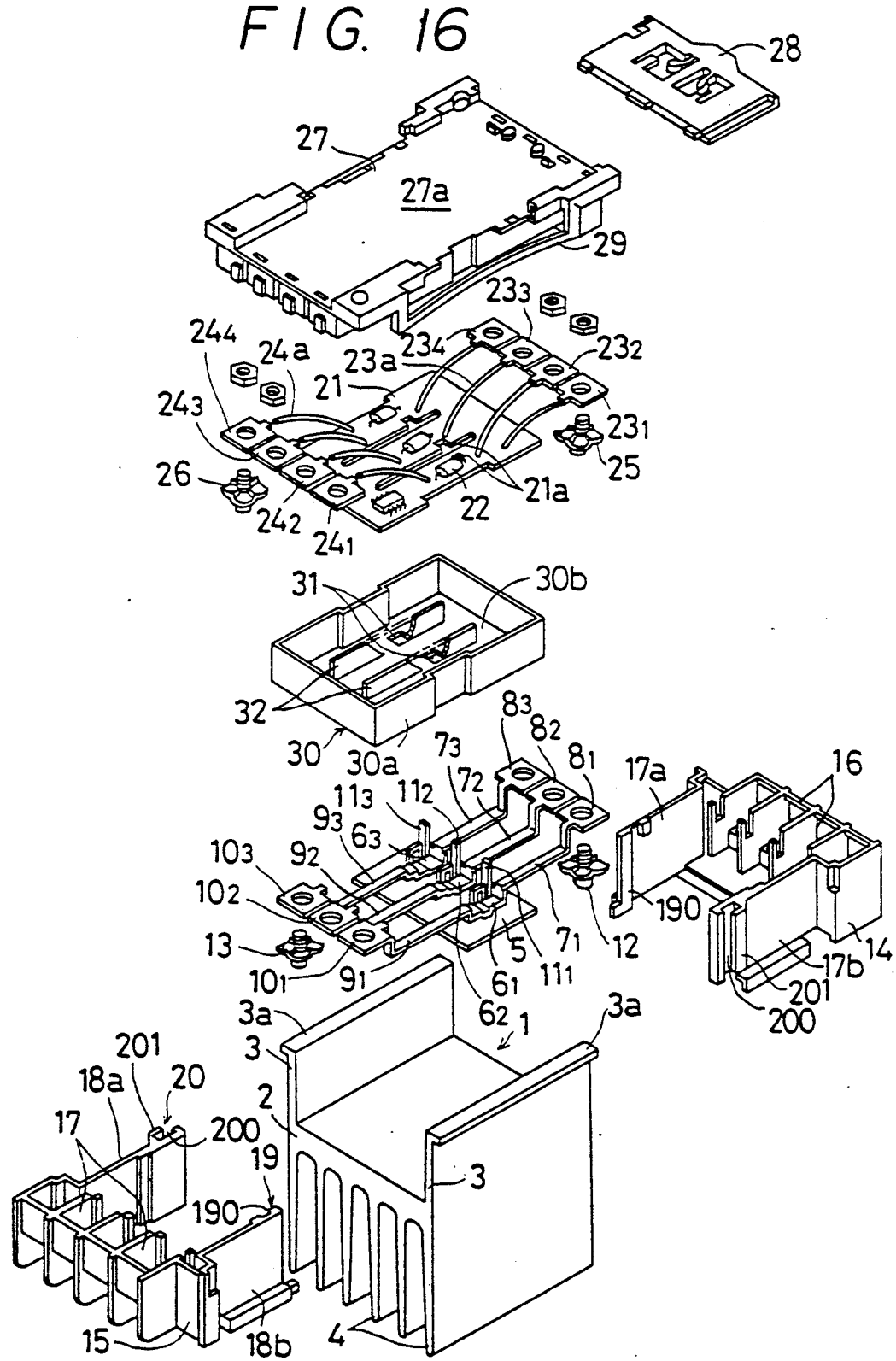
FIG. 16 is an exploded perspective view, similar to FIGS. 9 and 12 for the fourth and fifth preferred embodiments respectively, showing a sixth preferred embodiment of the electronic component assembly of the present invention, said sixth preferred embodiment electronic component assembly further including an intermediate insulating case.
Figure 17:
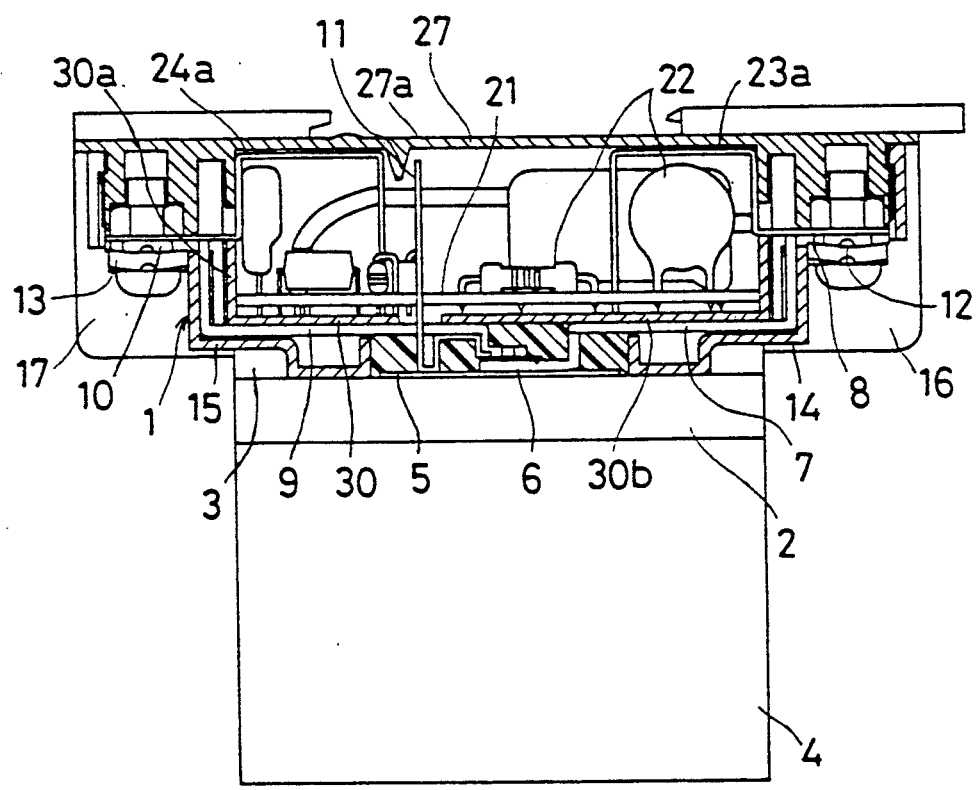
FIG. 17 is a schematic front sectional view, similar to FIGS. 10 and 13 for the fourth and fifth preferred embodiments respectively, showing said sixth preferred embodiment electronic component assembly.
Figure 18:
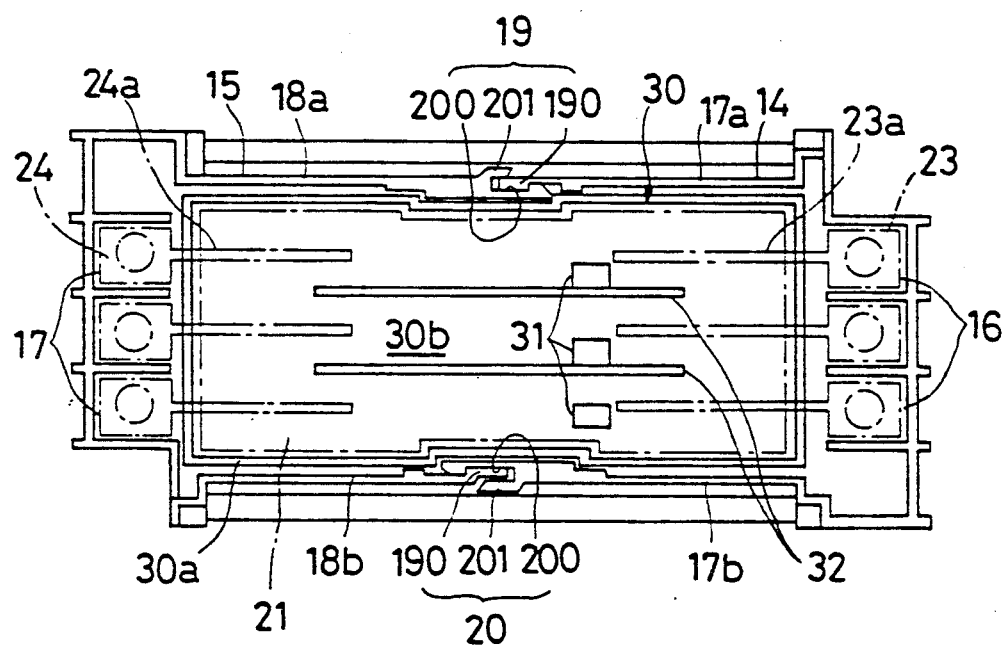
FIG. 18 is a schematic side sectional view, similar to FIGS. 11 and 14 for the fourth and fifth preferred embodiments respectively, showing said sixth preferred embodiment electronic component assembly.

Now, in FIG. 16, there is shown an exploded perspective view of a sixth preferred embodiment of the electronic component assembly of the present invention, while FIG. 17 is a schematic front sectional view of said sixth preferred embodiment electronic component assembly and FIG. 18 is a schematic side sectional view of said sixth preferred embodiment electronic component assembly. In these figures, reference numerals particularly correspond to those utilized in the descriptions and the drawings relating to the fourth preferred embodiment as detailed above.

This sixth preferred embodiment differs from the fourth preferred embodiment discussed and illustrated above, in two ways.

First, the engagement between the ends of the side wall portions 17a and 18a is performed by a different construction to that of the fourth and fifth preferred embodiments. In detail, the side wall portion 17a is formed with a ridge portion 190 on its inside side, and a groove portion 20 is formed on the outside side of the side wall portion 18a, and further a stop ridge 201 is formed on said outside side of said wall portion 18a. Similarly, the ends of the side wall portions 17b and 18b are engaged to one another by a ridge portion 190 formed on the inside side of the side wall portion 18b, a groove portion 20 formed on the outside side of the side wall portion 17b, and further a stop ridge 201 formed on said outside side of said side wall portion 17b. During fitting, the ridge portions 190 snap into the corresponding ones of the groove portions 20, with the ends of said ridge portions 190 abutting against the corresponding ones of the stop ridges 201. Thereby, the two case side members 14 and 15 are even more definitely and positively tightly held together towards the center of the electronic component assembly, so as to clamp the two side wall portions 3 between them and thereby to be held in position securely.

Thus, this construction means that, even if the side wall portions 17a and 18a of the two case side members 14 and 15 are poorly formed during the molding process therefor and become somewhat distorted, because of the positive snap together action outlined above, secure engagement of said side wall portions 17a and 18a together will in any case be assured.

Next, this sixth preferred embodiment of the electronic component assembly of the present invention is also distinguished, in that between the insulating plate 5 with the triacs 6₁, 6₂ and 6₃ mounted thereon, and the printed circuit board 21, there is fitted a box shaped insulating case 30 made of an insulating material such as synthetic resin. This insulating case 30 has a circumferential wall which surrounds the lead portions 7₁, 7₂, 7₃ and 9₁, 9₂, and 9₃ of the triacs 6₁, 6₂, and 6₃, and forther has a pair of division walls 32 for separating each of said triacs 6₁, 6₂, and 6₃ and its associated lead portions from its neighbor or neighbors which, as mentioned above, are associated with different phases of three phase AC power. And the bottom wall 30b of the insulating case 30 is also formed with holes 31 for passing the gates 11₁, 11₂, and 11₃ of the triacs 6₁, 6₂, and 6₃, and further the printed circuit board 21 is formed with holes 21a for passing said gates 11₁, 11₂, and 11₃ of said triacs 6₁, 6₂, and 6₃.

In assembling this electronic component assembly, the three triacs 6₁, 6₂, and 6₃ are fixedly secured to the internal surface of the bottom wall portion 2 of the main case member 1 by way of the electrically insulating plate 5, and then the two case side members 14 and 15 are inserted from the opposite sides of said bottom wall portion 2 and are coupled together as described above. After fitting the insulating case 30 in between the two case side members 14 and 15 over the triacs 6₁, 6₂, and 6₃, the printed circuit board 21 is fitted thereover, and the gates 11₁, 11₂, and 11₃ of the triacs 6₁, 6₂, and 6₃ are passed through the holes 21a on said printed circuit board 21 and are connected to appropriate components thereon. Lastly, the cover 27 is fitted over the top of this electronic component assembly, by the engagement pieces 29 thereof being fitted to the engagement ribs 3a of the side wall portions 3.

In this sixth preferred embodiment of the electronic component assembly of the present invention, if no such case as the insulating case 30 were provided, since the printed circuit board 21 is typically installed with its printed surface downwards, there might be a risk that the lead portions 7₁, 7₂, 7₃ and 9₁, 9₂, and 9₃ of the triacs 6₁, 6₂, and 6₃ would short circuit on portions of said printed circuit board 21. However, since the insulating case 30 is provided, this danger is positively prevented. And, since this insulating case 30 has a circumferential wall which surrounds said lead portions 7₁, 7₂, 7₃ and 9₁, 9₂, and 9₃ of the triacs 6₁, 6₂, and 6₃, the insulation between said lead portions and the electroconductive wall portions 3 of the main case member 1 is even further improved. Since said insulating case 30 further has a pair of division walls 32 for separating each of said triacs 6₁, 6₂, and 6₃ and its associated lead portions from its neighbor or neighbors which are associated with different phases of three phase AC power, good insulation between said three different AC phases is also ensured.

Although the present invention has been shown and described in terms of certain preferred embodiments thereof, and with reference to the appended drawings, it should not be considered as being particularly limited thereby. The details of any particular embodiment, or of the drawings, could be varied without, in many cases, departing from the ambit of the present invention. Accordingly, the scope of the present invention is to be considered as being delimited, not by any particular perhaps entirely fortuitous details of the disclosed preferred embodiments, or of the drawings, but solely by the legitimate and properly interpreted scope of the accompanying claims, which follow.

What is claimed is:

1. An electronic component assembly, comprising:
   a body construction which comprises a planar base portion having first and second opposed surfaces, an upper cover portion, which overlies the first surface of said planar base portion, and a fin projecting from the second surface of the planar base portion, the body construction having an interior space defined therein;
   an insulation plate member having a first surface secured directly to the first surface of the planar base portion; and
   a heat generating element completely and directly secured to the insulating plate member, the heat generating element being completely enclosed within the space defined in the body constructing;
   wherein said body construction comprises mutually opposing side walls rising from a surface of said planar base portion opposite to said fin.

2. An electronic component assembly, comprising:
   a body construction which comprises a planar base portion having first and second opposed surfaces, an upper cover portion, which overlies the first surface of said planar base portion, and a fin projecting from the second surface of the planar base portion, the body construction having an interior space defined therein;

an insulating plate member having a first surface secured directly to the first surface of the planar base portion;

a heat generating element completely and directly secured to the insulating plate member, the heat generating element being completely enclosed within the space defined in the body construction;

a printed circuit board, mounted on said insulating plate member having said heat generating element thereon, received in a space defined inside the body construction; and an insulating member fitted between the printed circuit board and said heat generating element, wherein the insulating member has a circumferential wall and further has internal dividing and insulating walls for separating said heat generating element from another hear generating element.

3. An electronic component assembly according to claim 2, wherein said insulating member is formed with an aperture for connecting said printed circuit board to said heat generating element.

4. An electronic component assembly, comprising:

a body construction which comprises a planar base portion and mutually opposing side walls rising from a surface of the planar base portion;

at least one fin projecting from the planar base portion of the construction opposite the side walls;

a heat generating element fixedly attached to the planar base portion of the body construction;

at least two case portions each of which is formed with at least two vertical wall portions, and each fitted with the vertical wall portions thereof extending on the inward side of the mutually opposing side walls of the body construction to define partitions between the side walls of the body construction and a space defined inside the body construction;

a printed circuit board accommodated in the space defined inside the body construction; and a cover having engagement member means formed thereon for retaining the cover on the body construction.

5. An electronic component assembly, comprising:

a body construction which comprises a planar base portion and mutually opposing side walls rising from a surface of the planar base portion;

at least one fin projecting from the planar base portion of the construction opposite the side walls;

a heat generating element fixedly attached to the planar base portion of the body construction;

at least two case portions each of which is formed with at least two vertical wall portions connected together, and each fitted with the vertical wall portions thereof extending on the inward side of the mutually opposing side walls of the body construction to define partitions between the side walls of the body construction and a space defined inside the body construction;

a printed circuit board accommodated in the space defined inside the body construction; and a cover having engagement member means formed thereon for retaining the cover on the body construction.

6. An electronic component assembly according to claim 5, wherein said heat generating element comprises a lead portion and an external terminal which is integrally formed with said lead portion.

7. An electrode component assembly according to claim 5, wherein comprising a protective cover fitted over said fin.

8. An electronic component assembly according to claim 7, wherein said protective cover is pierced with a hole not in register with said fin.

9. An electronic component assembly according to claim 5, wherein said connected vertical wall portions of said two case portions are formed one with an engagement groove and the other with an engagement ridge which engages with said engagement groove.

10. An electronic component assembly according to claim 9, wherein said one of said connected vertical wall portions of said two case portions is further formed with a stop ridge which engages with said engagement ridge, when said engagement ridge is engaged with said engagement groove.

* * * * *